United States Patent
Xiang et al.

(10) Patent No.: US 6,902,991 B2
(45) Date of Patent: Jun. 7, 2005

(54) SEMICONDUCTOR DEVICE HAVING A THICK STRAINED SILICON LAYER AND METHOD OF ITS FORMATION

(75) Inventors: Qi Xiang, San Jose, CA (US); Jung-Suk Goo, Stanford, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 275 days.

(21) Appl. No.: 10/282,513

(22) Filed: Oct. 24, 2002

(65) Prior Publication Data

US 2004/0087114 A1 May 6, 2004

(51) Int. Cl.[7] ............................................... H01L 21/04
(52) U.S. Cl. ...................................................... 438/510
(58) Field of Search ............................... 438/141, 510, 438/471, 752, 61

(56) References Cited

U.S. PATENT DOCUMENTS

| 5,155,571 A | * | 10/1992 | Wang et al. | 257/19 |
| 5,461,243 A | * | 10/1995 | Ek et al. | 257/190 |
| 5,906,951 A | * | 5/1999 | Chu et al. | 438/751 |
| 6,154,475 A | * | 11/2000 | Soref et al. | 372/45 |
| 6,583,437 B2 | * | 6/2003 | Mizuno et al. | 257/19 |
| 6,607,948 B1 | * | 8/2003 | Sugiyama et al. | 438/151 |
| 6,730,576 B1 | * | 5/2004 | Wang et al. | 438/413 |
| 6,841,430 B2 | * | 1/2005 | Sugawara et al. | 438/153 |

* cited by examiner

*Primary Examiner*—W. David Coleman
(74) *Attorney, Agent, or Firm*—Foley & Lardner LLP (57) ABSTRACT

A strained silicon layer is grown on a layer of silicon germanium and a second layer of silicon germanium is grown on the layer of strained silicon in a single continuous in situ deposition process. Both layers of silicon germanium may be grown in situ with the strained silicon. This construction effectively provides dual substrates at both sides of the strained silicon layer to support the tensile strain of the strained silicon layer and to resist the formation of misfit dislocations that may be induced by temperature changes during processing. Consequently the critical thickness of strained silicon that can be grown on substrates having a given germanium content is effectively doubled. The silicon germanium layer overlying the strained silicon layer may be maintained during MOSFET processing to resist creation of misfit dislocations in the strained silicon layer up to the time of formation of gate insulating material.

23 Claims, 5 Drawing Sheets

SEMICONDUCTOR DEVICE HAVING A THICK STRAINED SILICON LAYER AND METHOD OF ITS FORMATION

BACKGROUND OF THE INVENTION

1. Field of the Invention

The present invention relates to semiconductor integrated circuits, and in particular to semiconductor devices that incorporate strained silicon.

2. Related Technology

The continuous demand for improved performance in electronic devices has been addressed through advances in silicon processing and device technologies directed toward reduction in the size of individual semiconductor circuit components. However, economic and physical constraints are making continued reduction of device sizes more difficult, and so alternative solutions are being sought to allow increases in device performance to continue.

One option for increasing the performance of MOSFETs is to enhance the carrier mobility of silicon so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

Figure 1:
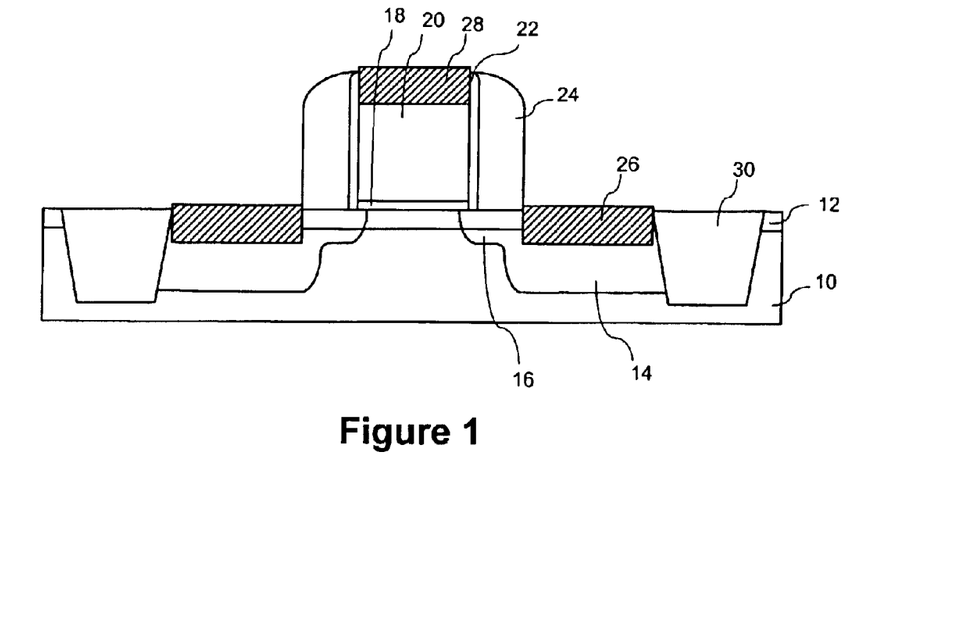
FIG. 1 shows a MOSFET using a layer of strained silicon formed in accordance with conventional processing.

An example of a MOSFET using a strained silicon layer is shown in FIG. 1. The MOSFET is fabricated on a substrate comprising a silicon germanium layer 10 on which is formed an epitaxial layer of strained silicon 12. The MOSFET uses conventional MOSFET structures including deep source and drain regions 14, shallow source and drain extensions 16, a gate oxide layer 18, a gate 20 surrounded by spacers 22, 24, silicide source and drain contacts 26, a silicide gate contact 28, and shallow trench isolations 30. The channel region of the MOSFET includes the strained silicon material, which provides enhanced carrier mobility between the source and drain.

While the theoretical advantages of strained silicon are promising, the fabrication and processing of strained silicon presents a number of problems. One problem is the formation of "misfit dislocations" in the strained silicon as the result of temperature changes. Misfit dislocations are dislocations in the silicon lattice that effectively release the strain applied to the silicon lattice. Misfit dislocations are primarily caused by mismatch between the strained silicon lattice and the lattice of the underlying silicon germanium supporting layer. The amount of misfit dislocations in a strained silicon layer may increase as the result of thermal factors. One instance in which misfit dislocations may be caused by thermal factors is during cooling after deposition of a strained silicon layer. Another instance in which misfit dislocations may occur is during exposure to high temperatures, e.g. 1000 degrees C. and higher, such as during formation of shallow trench isolations. Such high temperatures are believed to cause depletion of the germanium content of the silicon germanium substrate, leading to formation of misfit dislocations in the overlying strained silicon. The rate of formation of misfit dislocations rises exponentially with increases in temperature.

It has been determined that a strained silicon layer has a critical thickness, above which misfit dislocations become significantly more likely to occur. The critical thickness depends on the amount of tensile strain applied to the silicon lattice, and thus on the germanium content of the underlying silicon germanium layer. For example, it has been determined that a silicon germanium layer having approximately 20% germanium content can support a critical thickness of approximately 200 Angstroms without the risk of significant misfit dislocations, whereas a silicon germanium layer having approximately 30% germanium content can support a critical thickness of only approximately 80 Angstroms.

Therefore the application of current strained silicon technology to MOSFET design is hampered by conflicting limitations, in that strained silicon carrier mobility is enhanced by an increase in the germanium content of the underlying layer, yet the critical thickness of the strained silicon is reduced by an increase of the germanium content of the underlying layer. These conflicts make practical applications difficult to achieve. For example, it has been determined empirically that at least approximately 70 Angstroms of strained silicon are required to provide a meaningful improvement in MOSFET performance. However, in order to account for consumption of silicon during processing, a layer of approximately double that thickness must be formed initially, and to avoid misfit dislocation in a layer of such thickness, the germanium content of the underlying layer must be restricted to approximately 20%. The resulting strain applied to the strained silicon layer has been found to have relatively little effect on hole mobility, and therefore it is difficult to provide a meaningful application of strained silicon in PMOS devices. In addition to the foregoing considerations, the tensile strain of the strained silicon layer and hence its carrier mobility may be further degraded through the formation of misfit dislocations caused by both the increases and the decreases in temperature that are typically encountered during processing, such as during formation of shallow trench isolations. Therefore, while the limiting factors of strained silicon technology can be balanced to achieve limited carrier mobility enhancement in some applications, current technology does not offer a way to impart enough strain to produce significant carrier mobility enhancement without also introducing mobility-reducing defects and strain relaxation.

SUMMARY OF THE INVENTION

It is therefore an object of the present invention to provide a strained silicon layer having a thickness greater than the conventional critical thickness yet not having the amount of misfit dislocations that are characteristic of a strained silicon layer having a thickness greater than the conventional critical thickness.

It is another object of the present invention to provide a MOSFET device that incorporates a strained silicon layer having a thickness greater than the conventional critical thickness.

In accordance with embodiments of the invention, a strained silicon layer is supported between an underlying layer of silicon germanium and an overlying layer of silicon germanium. The layers of silicon germanium and the layer of strained silicon are grown in a single continuous in situ deposition process. This construction effectively provides dual substrates at both surfaces of the strained silicon layer that support the tensile strain of the strained silicon layer and that resist the formation of misfit dislocations. Consequently the thickness of strained silicon that can be grown without a substantial risk of susceptibility to significant misfit dislocations is effectively doubled for a given germanium content of the silicon germanium layers. The overlying silicon germanium layer may be maintained during MOSFET processing up to the time of formation of gate oxide so as to avoid creation of misfit dislocations in the strained silicon layer as the result of significant temperature changes occurring during processing prior to that stage.

In accordance with one embodiment of the invention, a thick strained silicon layer is formed. Initially a semiconductor substrate is provided. A first layer of silicon germanium is grown on the semiconductor substrate. A layer of strained silicon is then grown on the first layer of silicon germanium, and a second layer of silicon germanium is then grown on the strained silicon layer. The first and second silicon germanium layers and the layer of strained silicon are grown together in a single continuous in situ deposition process. The first and second silicon germanium layers support the tensile strain in the strained silicon layer and resist the formation of misfit dislocations in the strained silicon layer during subsequent cooling and heating of the strained silicon layer, even where the strained silicon layer has a thickness in excess of the conventional critical thickness.

In accordance with another embodiment of the invention, a semiconductor device comprising a strained silicon layer having a thickness greater than the critical thickness is formed. Initially a substrate having a first layer of silicon germanium is provided. A layer of strained silicon is then formed on the first layer of silicon germanium, and a second layer of silicon germanium is formed on the strained silicon layer in a single continuous in situ deposition process. The first layer of silicon germanium may also be formed in the same single continuous in situ deposition process. The first and second silicon germanium layers support the tensile strain in the strained silicon layer and resist the formation of misfit dislocations in the strained silicon layer during subsequent cooling and heating of the strained silicon layer. Shallow trench isolations that extend through the second layer of silicon germanium and through the layer of strained silicon and into the first layer of silicon germanium are then formed. The second layer of silicon germanium is removed, and a MOSFET comprising the layer of strained silicon is formed between shallow trench isolations.

In accordance with another embodiment of the invention, MOSFET comprises a channel region, a gate insulator formed over the channel region, a gate formed on the gate insulator, and source and drain regions located on opposing sides of the channel regions. At least the channel region of the MOSFET is comprised of a layer of strained silicon having a thickness that is greater than the conventional critical thickness determined in accordance with the germanium content of a silicon germanium layer on which the strained silicon layer is formed.

DESCRIPTION OF THE DRAWINGS

Embodiments of the invention are described in conjunction with the following drawings, in which.

DESCRIPTION OF PREFERRED EMBODIMENTS

Figure 2A:
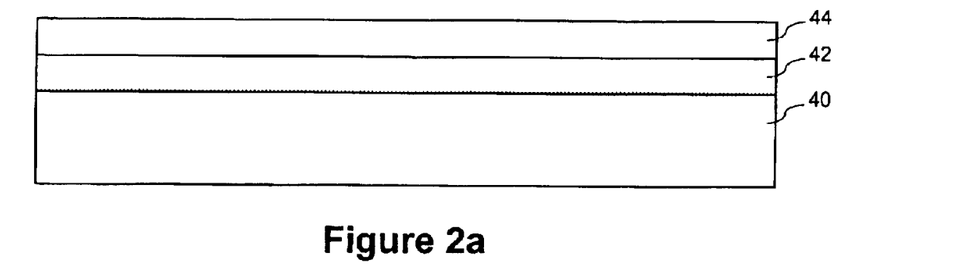
FIGS. 2a, 2b, 2c, 2d, 2e, 2f, 2g, 2h and 2i show structures formed during production of a MOSFET in accordance with a first preferred embodiment of the invention.

FIGS. 2a–2i show structures formed during fabrication of a strained silicon MOSFET in accordance with a preferred embodiment of the invention. FIG. 2a shows a structure comprising a layer of strained silicon 42 that is formed over an underlying first layer of silicon germanium 40 and that is covered by an overlying second layer of silicon germanium 44. The silicon germanium layers 40, 44 preferably have a composition $Si_{1-x}Ge_x$, where x is generally in the range of 0.1 to 0.4. As noted above, a silicon germanium layer having approximately 30% germanium content is capable of supporting a strained silicon layer of approximately 80 Angstroms without the risk of introduction of significant misfit dislocations during cooling or subsequent thermal processing. In contrast, the strained silicon layer 42 of the preferred embodiment is supported at both its surfaces by silicon germanium layers 40, 44 having 30% germanium contents. Therefore the strained silicon layer may be formed to a thickness of approximately 160 Angstroms without the risk of introduction of significant misfit dislocations during cooling or subsequent thermal processing.

The silicon germanium layer 40 is typically grown on and supported by a silicon wafer (not shown). Silicon germanium may be grown, for example, by chemical vapor deposition using $Si_2H_6$ (disilane) and $GeH_4$ (germane) as source gases, with a substrate temperature of 600–900 degrees C., a $Si_2H_6$ partial pressure of 30 mPa, and a $GeH_4$ partial pressure of 60 mPa. $SiH_4$ (silane) may be used in alternative processes. Growth of the first silicon germanium layer 40 may be initiated using these ratios, or alternatively the partial pressure of $GeH_4$ may be gradually increased beginning from a lower pressure or zero pressure to form a gradient composition having the desired germanium content (e.g. 30%) at its upper surface, i.e. at the junction with the strained silicon layer 42. The second silicon germanium layer 44 that overlies the strained silicon layer 42 is likewise formed so as to have the desired germanium content (e.g. 30%) at its junction with the strained silicon layer 42 so as to provide maximum support of the tensile strain induced in the strained silicon layer 42, but may thereafter be graded if desired. The thicknesses of the first silicon germanium layer 40 and the second silicon germanium layer 44 may be determined in accordance with the particular application.

The strained silicon layer 42 is preferably grown by selective epitaxial growth through a chemical vapor deposition (CVD) process, for example using $Si_2H_6$ as a source gas with a partial pressure of 30 mPa and a substrate temperature of approximately 600–900 degrees C. Preferably the strained silicon layer 42 and both of the silicon germanium layers 40, 44 are grown in a single continuous in situ deposition process with minimal temperature change so as to avoid creation of misfit dislocations in the strained silicon as the result of temperature change, as well as to prevent formation of native oxide layers between deposition of each layer. This may be achieved by cutting the flow of a germanium source gas (e.g. germane) into the deposition chamber after a desired thickness of the first silicon germanium layer has been achieved, so as to grow a strained silicon layer having substantially no germanium content. Subsequently, when a desired thickness of strained silicon has been grown, the germanium source gas may be reintroduced into the deposition chamber in,order to the change the composition of the deposited material from silicon to silicon germanium having the desired germanium content. At least the strained silicon layer 42 and the upper silicon germanium layer 44 should be formed in a single continuous in situ process, preferably with minimal temperature change. It may also be desirable to grade any changes of temperature between the optimal strained silicon deposition temperature and the optimal silicon germanium deposition temperature in a manner that takes into account the thickness of silicon germanium grown on the strained silicon layer so that an appropriate amount of silicon germanium is present on the upper surface of the strained silicon layer to provide support for the strained silicon layer as temperature changes occur. Where only the strained silicon layer 42 and the second silicon germanium layer 44 are grown in situ, the first silicon germanium layer 40 may be processed prior to growth of strained silicon, such as by chemical mechanical polishing to reduce surface roughness.

As noted above, a silicon germanium layer having approximately 30% germanium content is capable of supporting a strained silicon layer of approximately 80 Angstroms without the risk of significant misfit dislocations during cooling or subsequent thermal processing. In contrast, the strained silicon layer 42 of the preferred embodiment is supported at both of its surfaces by the lower and upper silicon germanium layers 40, 44 each having approximately 30% germanium contents. Therefore the strained silicon layer 42 may be formed to have a thickness of greater than approximately 80 Angstroms, typically in excess of approximately 140 Angstroms, and potentially as much as approximately 160 Angstroms, without the risk of significant misfit dislocations during cooling or subsequent thermal processing.

Figure 2B:
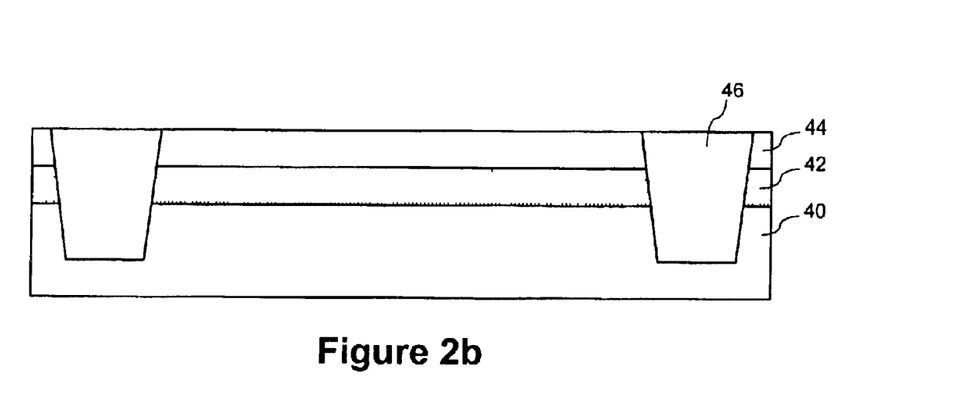

FIG. 2b shows the structure of FIG. 2a after formation of shallow trench isolations 46 that extend through the second silicon germanium layer 44 and the strained silicon layer 42 and into the first silicon germanium layer 40. The shallow trench isolations 46 are formed by etching tapered trenches in the silicon germanium layers 40, 44 and strained silicon layer 42 using a mask such as a bi-layer hardmask. After removing remaining hardmask material, a short thermal oxidation is performed, and then a layer of silicon oxide is deposited to a thickness that is sufficient to fill the trenches, such as by low pressure CVD (LPCVD) TEOS or atmospheric pressure ozone TEOS. The silicon oxide layer is then densified, and then planarized such as by chemical mechanical polishing or an etch back process, leaving shallow trench isolations 46 that are level with the surface of the upper silicon germanium layer 44. The formation of the shallow trench isolations 46 may be preceded by a channel stop implant. The upper layer of silicon germanium 44 assists in preventing the formation of misfit dislocations in the strained silicon layer 42 at the elevated temperatures used during formation of the shallow trench isolations 46. The upper layer of silicon germanium 44 also assists in preventing oxidation of the surface of the strained silicon layer 42 during formation of the shallow trench isolations 46.

Figure 2C:
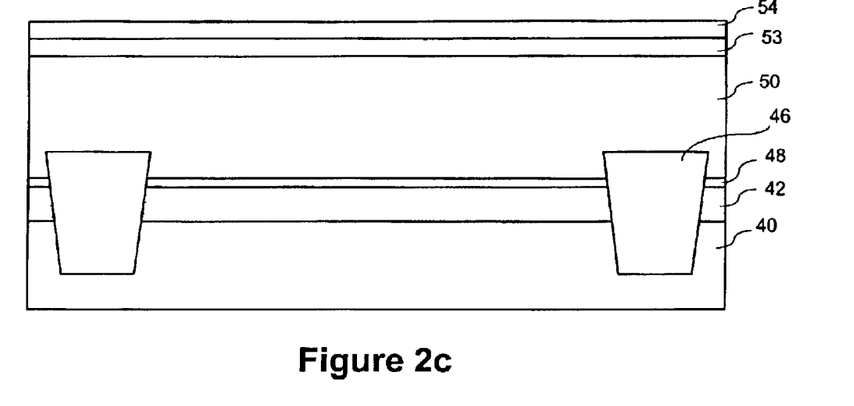

FIG. 2c shows the structure of FIG. 2b after removal of the second layer of silicon germanium, followed by the formation of several layers of different materials. The upper silicon germanium layer may be removed by a selective wet etch that has a very high etch selectivity for silicon germanium compared to silicon. Alternately, the silicon germanium may be oxidized through a highly controllable oxidation process, such as using hot steam, followed by removal in an HF solution. The layers of material that are subsequently formed include a gate insulating layer 48 that is formed on the strained silicon layer 42. The gate insulating layer 48 is typically silicon oxide but may be another material such as oxide-nitride-oxide (ONO). An oxide may be grown by thermal oxidation of the strained silicon layer, or may be deposited by chemical vapor deposition. Formed over the gate insulating layer 48 is a gate conductive layer 50. The gate conductive layer 50 typically comprises polysilicon but may alternatively comprise another material such as polysilicon implanted with germanium. Overlying the gate conductive layer 50 is a bi-layer hardmask structure comprising a bottom hardmask layer 52, also referred to as a bottom antireflective coating (BARC), and an upper hardmask layer 54. The bottom hardmask layer 52 is typically silicon oxide (e.g. $SiO_2$) and the upper hardmask layer 54 is typically silicon nitride (e.g. $Si_3N_4$).

Figure 2D:
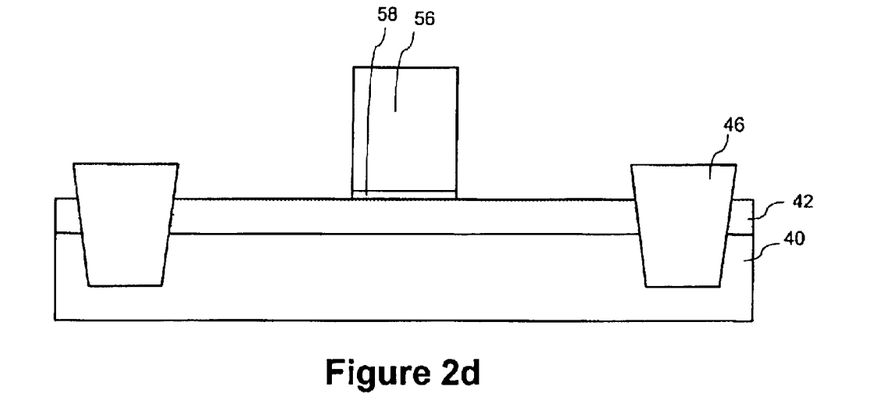

FIG. 2d shows the structure of FIG. 2c after patterning of the gate conductive layer and gate insulating layer to form a gate 56 and a self-aligned gate insulator 58. Patterning is performed using a series of anisotropic etches that patterns the upper hardmask layer using a photoresist mask as an etch mask, then patterns the lower hardmask layer using the patterned upper hardmask layer as an etch mask, then patterns the gate conductive layer using the patterned lower hardmask layer as an etch mask, then patterns the gate insulating layer using the gate 56 as a hardmask.

Figure 2E:
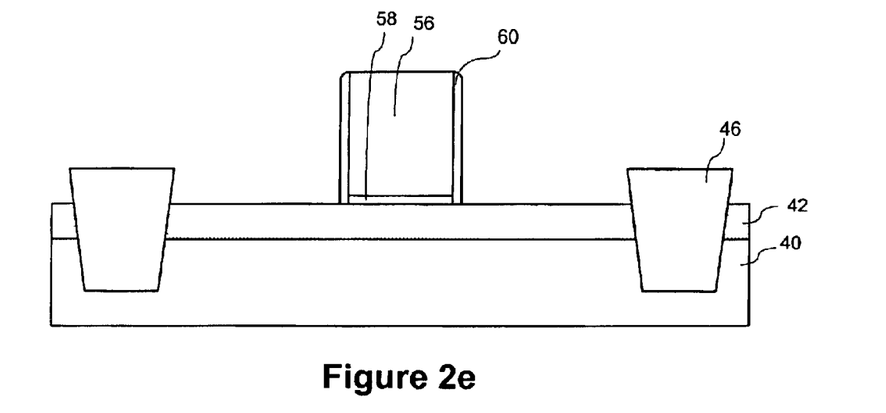

FIG. 2e shows the structure of FIG. 2d after formation of a thin first gate spacer 60 around the gate 56 and gate insulator 58. The thin first gate spacer 60 is preferably formed by deposition of a conformal layer of a protective material followed by anisotropic etching to remove the protective material from the non-vertical surfaces to leave the thin first gate spacer 60 formed around the gate 56 and gate insulator 58. The thin first gate spacer 60 is preferably formed of silicon oxide or silicon nitride.

Figure 2F:
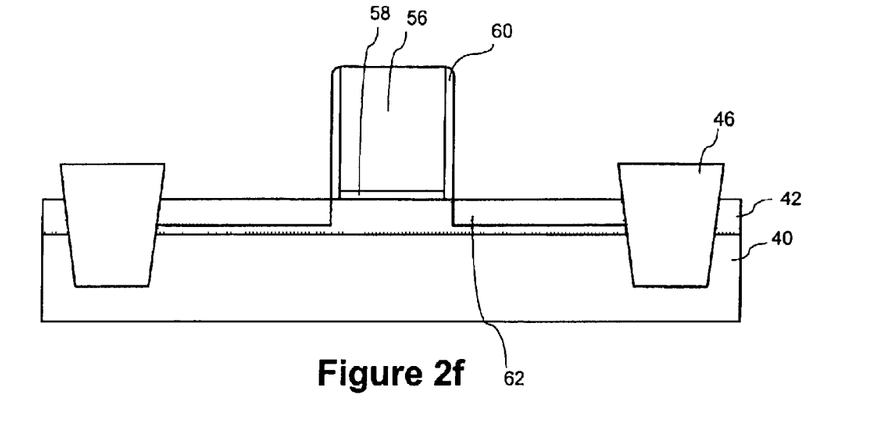

FIG. 2f shows the structure of FIG. 2e after implantation of dopant to form shallow source and drain extensions 62 in the strained silicon layer 42 at opposing sides of the channel region. The shallow source and drain extensions 62 typically have a thickness of 200–400 Angstroms and therefore may exceed the depth of the strained silicon layer 42 or may be contained within the strained silicon layer 42, depending on the particular implementation. Halo regions (not shown) may be implanted prior to implantation of the shallow source and drain extensions 62. Halo regions are regions that are doped with a dopant that is opposite in conductivity to the dopant of the source and drain extensions 62. The halo regions help to suppress the short channel "punchthrough" effect by shortening the depletion regions at the ends of the source and drain extensions 62. The halo regions are preferably implanted using a low energy at a small angle to the surface of the substrate so that the halo regions extend beneath the gate 56 to beyond the anticipated locations of the ends of the source and drain extensions 62 after annealing. Like the source and drain extensions 62, the halo regions are formed at opposing sides of the channel region and extend toward the channel region beyond the ends of the source and drain extensions to be formed.

Figure 2G:
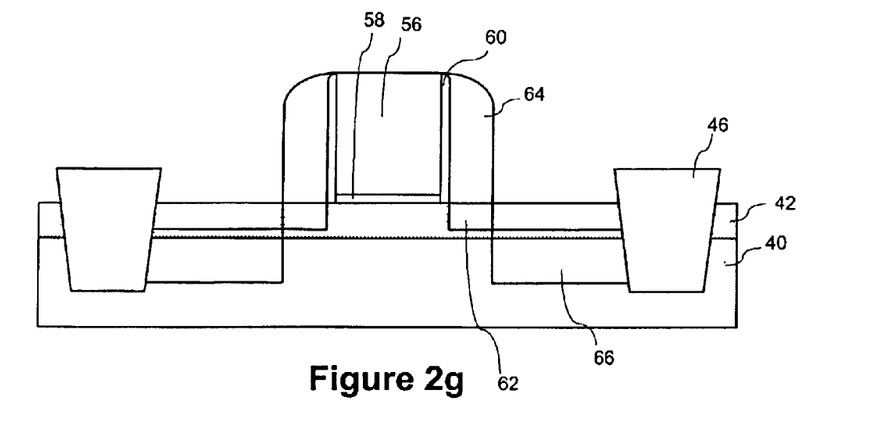

FIG. 2g shows the structure of FIG. 2f after formation of a second spacer 64 around the gate 56 and the thin first spacer 60, followed by implantation of dopant to form deep source and drain regions 66 in the strained silicon 42 and silicon germanium 40 layers. The second spacer 64 serves as an implant mask during implantation of the deep source and drain regions 66 to define the position of the source and drain regions 66 relative to the channel region of the MOSFET.

Figure 2H:
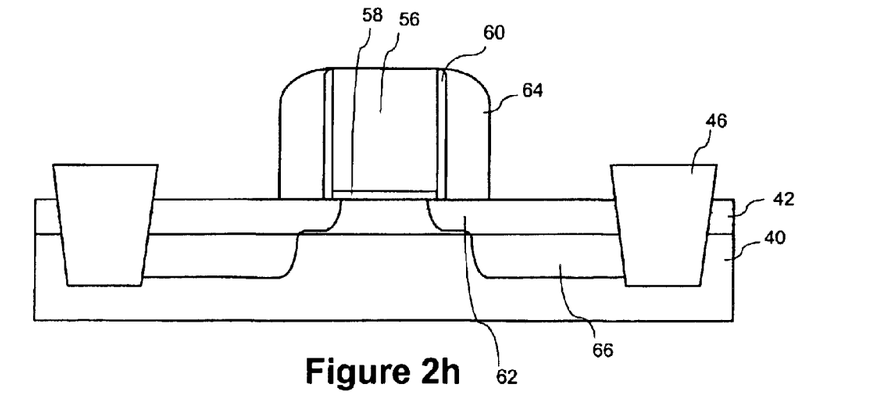

FIG. 2h shows the structure of FIG. 2g after performing rapid thermal annealing (RTA) to anneal the strained silicon layer 42 and silicon germanium layer 40 and to activate the dopants implanted in the shallow source and drain extensions 62 and the deep source and drain regions 66. During annealing some diffusion of implanted dopant occurs in the strained silicon layer 42 and the silicon germanium layer 40.

Figure 2I:
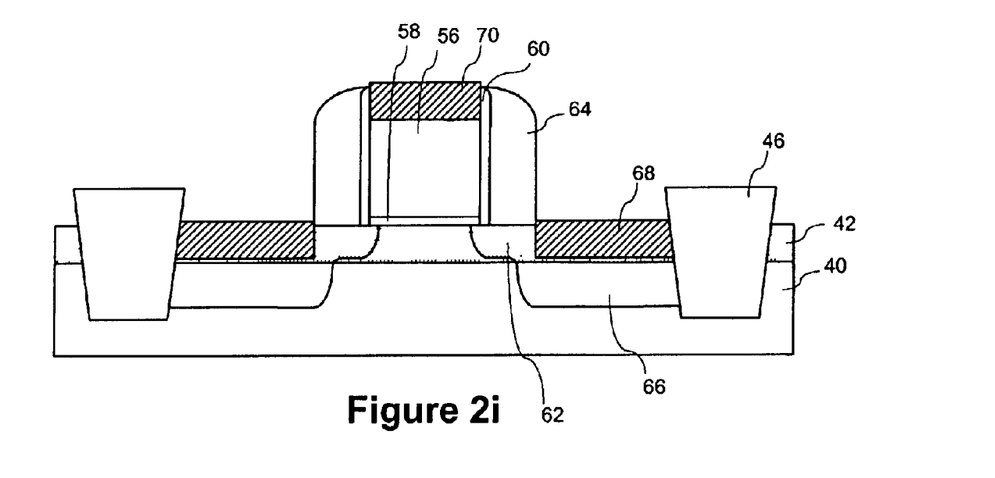

FIG. 2i shows the structure of FIG. 2h after formation of silicide contacts 68 on the source and drain regions 66 and formation of a silicide contact 70 on the gate 58. The silicide contacts are formed of a compound comprising a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote silicide formation at the points of contact between the metal and underlying semiconductor materials, followed by removal of residual metal.

While the processing of FIGS. 2a–2i represents a presently preferred embodiment of the invention, those having ordinary skill in the art will recognize that the thick strained silicon layer as illustrated in FIG. 2a has applications in a wide range of alternative embodiments. For example, while the MOSFET formed by the processing of FIGS. 2a–2i is of the type typically fabricated on a semiconductor substrate, in other embodiments the strained silicon layer of the present invention may be applied to a silicon on insulator (SOI) structure, such as a FinFET, in which a semiconductor device is fabricated on an insulating substrate that provides isolation from other devices.

Figure 3:
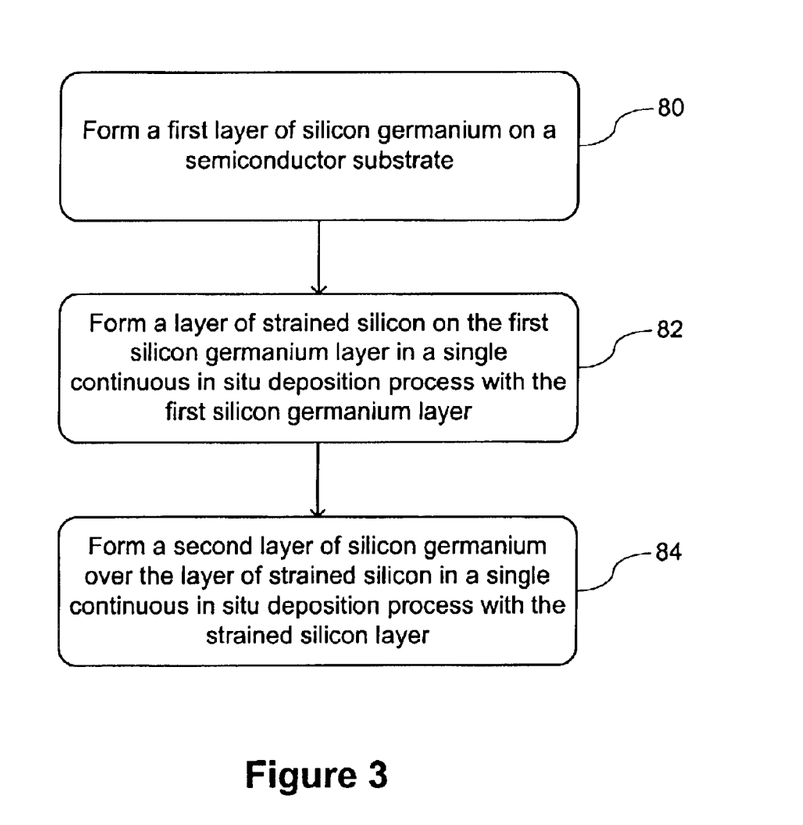
FIG. 3 shows a process flow encompassing the first preferred embodiment and alternative embodiments.

Therefore device construction is not limited to the embodiment of FIGS. 2a–2i. FIG. 3 shows a process flow for forming a strained silicon layer that encompasses the preferred embodiment of FIGS. 2a–2i, the aforementioned alternative embodiments and other alternatives. Initially a silicon germanium layer is formed on a semiconductor substrate (80). A layer of strained silicon is then formed on the first layer of silicon germanium in a single continuous in situ deposition process with the first layer of silicon germanium (82). The layer of strained silicon preferably has a thickness in excess of the conventional critical thickness determined in accordance with the germanium content of the first layer of silicon germanium. A second layer of silicon germanium is then formed on the layer of strained silicon in a single continuous in situ deposition process with the strained silicon layer (84). The first and second silicon germanium layers maintain the tensile strain of the strained silicon layer and resist the formation of misfit dislocations in the strained silicon layer even where the strained silicon layer has a thickness in excess of the critical thickness.

Figure 4:
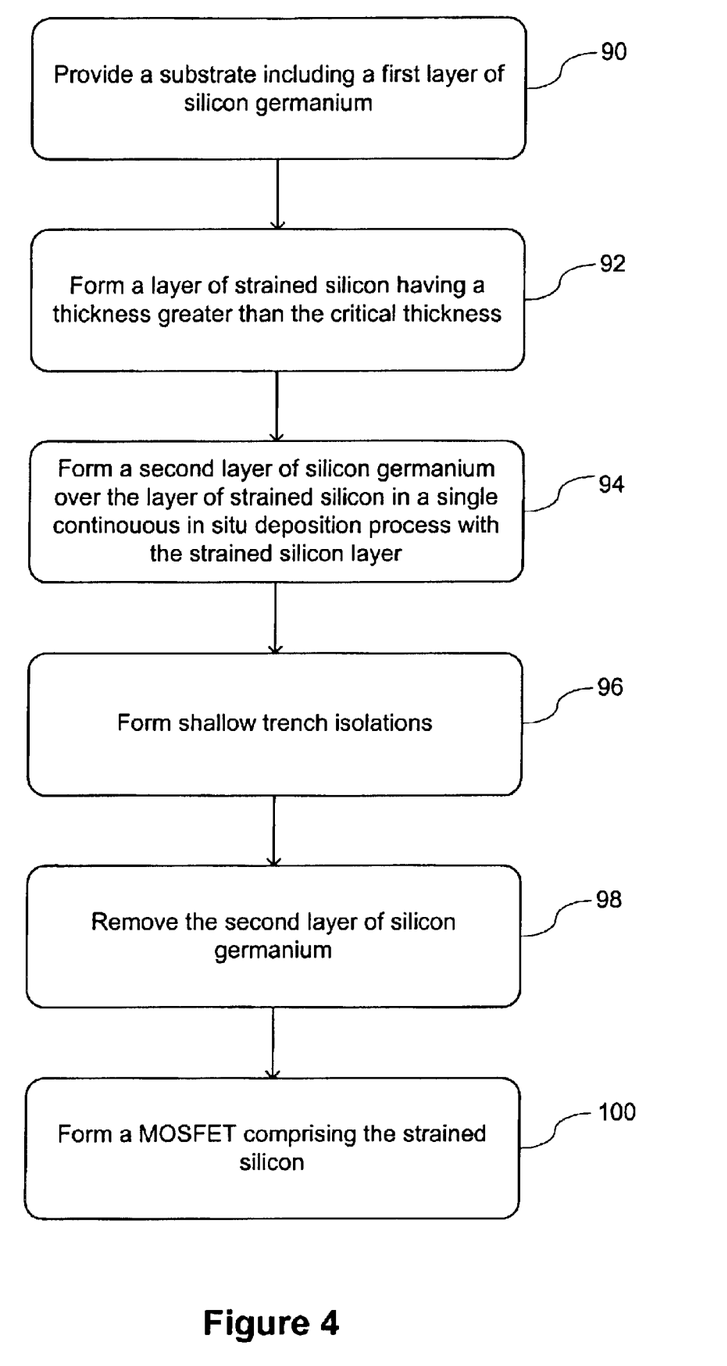
FIG. 4 shows a process flow encompassing the first preferred embodiment and alternative embodiments.

FIG. 4 shows a second process flow for forming a semiconductor device that encompasses the preferred embodiment of FIGS. 2a–2i and other alternatives. Initially a substrate is provided (90). The substrate includes a first layer of silicon germanium. A layer of strained silicon is then formed on the first layer of silicon germanium (92). The layer of strained silicon may be formed in a single continuous in situ deposition process with the first layer of silicon germanium. The layer of strained silicon preferably has a thickness in excess of the conventional critical thickness determined in accordance with the germanium content of the first layer of silicon germanium. A second layer of silicon germanium is then formed on the layer of strained silicon in a single continuous in situ deposition process with the layer of strained silicon (94). Shallow trench isolations extending through the second layer of silicon germanium and through the layer of strained silicon and into the first layer of silicon germanium are then formed (96). The second layer of silicon germanium is then removed (98), and a MOSFET comprising the strained silicon layer is formed between the shallow trench isolations (100).

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for forming a strained silicon layer, comprising:

forming a first layer of silicon germanium on a semiconductor substrate by chemical vapor deposition using a source gas comprising silicon and a source gas comprising germanium;

forming a layer of strained silicon on the first layer of silicon germanium in a single continuous in situ deposition process with the first layer of silicon germanium by cutting the flow of the source gas comprising germanium; and forming a second layer of silicon germanium on the strained silicon layer in a single continuous in situ deposition process with the layer of strained silicon by reintroducing the source gas comprising germanium, wherein the first and second silicon germanium layers support a tensile strain of the strained silicon layer and resist the formation of misfit dislocations in the strained silicon layer.

2. The method claimed in claim 1, wherein the first silicon germanium layer has a composition $Si_{1-x}Ge_x$, where x is in the range of 0.1 to 0.4.

3. The method claimed in claim 1, wherein the first and second silicon germanium layers have an approximately equal germanium content at respective junctions with the strained silicon layer.

4. The method claimed in claim 1, wherein the layer of stained silicon has a thickness in excess of a critical thickness determined in accordance with a germanium content of the first layer of silicon germanium.

5. The method claimed in claim 2, wherein x is approximately 0.3 and the thickness of the strained silicon layer exceeds 140 Angstroms.

6. A method for forming a semiconductor device, comprising:

provising a substrate comprising a first layer of silicon germanium;

forming a layer of strained silicon on the first layer of silicon germanium;

forming a second layer of silicon germanium on the strained silicon layer in a single continuous in situ deposition process with the layer of strained silicon;

forming shallow trench isolations extending through the second layer of silicon germanium and the through layer of strained silicon and into the first layer of silicon germanium;

removing the second layer of silicon germanium between the shallow trench isolations; and forming a metal oxide semiconductor field effect transistor (MOSFET) comprising the layer of strained silicon between shallow trench isolations.

7. The method claimed in claim 6, wherein the layer of strained silicon has a thickness in excess of a critical thickness determined in accordance with a germanium content of the first layer of silicon germanium.

8. The method claimed in claim 6, wherein the first and second silicon germanium layers support a tensile strain of the strained silicon layer and resist the formation of misfit dislocations in the strained silicon layer having the thickness in excess of the critical thickness prior to removing the second layer of silicon germanium.

9. The method claimed in claim 6, wherein the first silicon germanium layer has a composition $Si_{1-x}Ge_x$, where x is in the range of 0.1 to 0.4.

10. The method claimed in claim 6, wherein the first and second silicon germanium layers have an approximately equal germanium content at respective junctions with the strained silicon layer.

11. The method claimed in claim 6, wherein forming a MOSFET on the strained silicon comprises:

forming a gate insulating layer on the strained silicon layer;

forming a gate conductive layer on the gate insulating layer;

patterning the gate conductive layer to form a gate overlying the gate insulating layer;

implanting shallow source and drain extensions;

implanting deep source and drain regions; and forming silicide source and drain contacts and a silicide gate contact.

12. The method claimed in claim 6, wherein the first layer of silicon germanium, the strained silicon layer and the second layer of silicon germanium are formed together in a single continuous in situ deposition process.

13. A MOSFET device formed in accordance with the method recited in claim 6.

14. The method claimed in claim 6, wherein the silicon germanium layer is formed on a semiconductor substrate.

15. The method claimed in claim 6, wherein the silicon germanium layer is formed on an insulating substrate.

16. The method claimed in claim 11, wherein implanting shallow source and drain extensions is preceded by forming a first spacer around the gate and gate insulator.

17. The method claimed in claim 11, wherein the gate comprises polysilicon.

18. The method claimed in claim 11, wherein the gate insulator comprises silicon oxide.

19. The method claimed in claim 11, wherein implanting source and drain extensions is preceded by implanting halo regions, the halo regions extending toward a channel region beyond ends of the source and drain extensions to be formed, the halo regions comprising a dopant having a conductivity type opposite to the conductivity type of a dopant of the source and drain extensions.

20. The method claimed in claim 16, further comprising annealing to activate implanted dopants.

21. The method claimed in claim 16, wherein implanting deep source and drain regions is preceded by forming a second spacer around the first spacer, and wherein the second spacer serves as an implantation mask during implanting of the deep source and drain regions.

22. A method for forming a semiconductor device, comprising:

providing a substrate comprising a first layer of silicon germanium;

forming a layer of strained silicon on the first layer of silicon germanium;

forming a second layer of silicon germanium on the strained silicon layer in a single continuous in situ deposition process with the layer of strained silicon;

forming shallow trench isolations extending throught he second layer of silicon germanium and the through layer of strained silicon and into the first layer of silicon germanium;

removing the second layer of silicon germanium between the shallow trench isolations; and forming a metal oxide semiconductor field effect transistor (MOSFET) comprising the layer of strained silicon between shallow trench isolations, wherein the first layer of silicon germanium, the strained silicon layer and the second layer of silicon germanium are formed together in a single continuous in situ deposition process, and wherein the first and second silicon germanium layers support a tensile strain of the strained silicon layer and resist the formation of misfit dislocations in the strained silicon layer having the thickness in excess of the critical thickness prior to removing the second layer of silicon germanium.

23. A method for forming a semiconductor device, comprising:

providing a substrate comprising a first layer of silicon germanium;

forming a layer of silicon on the first layer of silicon germanium;

forming a second layer of silicon germanium on the silicon layer in a single continuous in situ deposition process with the layer of silicon;

forming shallow trench isolations extending through the second layer of silicon germanium and the through layer of silicon and into the first layer of silicon germanium;

removing the second layer of silicon germanium between the shallow trench isolations;

forming a gate insulating layer on the silicon layer;

forming a gate conductive layer on the gate insulating layer;

patterning the gate conductive layer to form a gate overlying the gate insulating layer;

implanting shallow source and drain extensions;

implanting deep source and drain regions; and forming silicide source and drain contacts and a silicide gate contact.

* * * * *